(12) United States Patent
Kamakura

(10) Patent No.: US 9,732,421 B2
(45) Date of Patent: Aug. 15, 2017

(54) SUBSTRATE PROCESSING APPARATUS

(71) Applicant: HITACHI KOKUSAI ELECTRIC INC., Tokyo (JP)

(72) Inventor: Tsukasa Kamakura, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/671,211

(22) Filed: Mar. 27, 2015

(65) Prior Publication Data

US 2016/0060755 A1 Mar. 3, 2016

(30) Foreign Application Priority Data

Aug. 27, 2014 (JP) ................. 2014-172451

(51) Int. Cl.
| | | |
|---|---|---|
| C23F 1/00 | (2006.01) | |
| H01L 21/306 | (2006.01) | |
| C23C 16/44 | (2006.01) | |
| C23C 16/46 | (2006.01) | |
| C23C 16/455 | (2006.01) | |
| C23C 16/52 | (2006.01) | |

(52) U.S. Cl.
CPC ...... C23C 16/4412 (2013.01); C23C 16/4405 (2013.01); C23C 16/455 (2013.01); C23C 16/45591 (2013.01); C23C 16/46 (2013.01); C23C 16/52 (2013.01)

(58) Field of Classification Search
CPC ................................. C23C 16/4412
USPC ................................... 156/345.29
See application file for complete search history.

(56) References Cited

U.S. PATENT DOCUMENTS

| | | | | |
|---|---|---|---|---|
| 5,556,474 A | * | 9/1996 | Otani .................. | C23C 16/4401 118/723 E |
| 5,885,356 A | * | 3/1999 | Zhao .................. | C23C 16/4401 118/715 |
| 6,238,514 B1 | * | 5/2001 | Gu ....................... | B01D 5/0036 118/715 |
| 8,372,201 B2 | | 2/2013 | Provencher et al. | |
| 8,945,306 B2 | | 2/2015 | Tsuda | |
| 9,018,105 B2 | | 4/2015 | Strauch | |
| 2003/0164225 A1 | * | 9/2003 | Sawayama ............ | C23C 16/24 156/345.29 |

(Continued)

FOREIGN PATENT DOCUMENTS

| | | |
|---|---|---|
| JP | 05-86476 A | 4/1993 |
| JP | 06-291054 A | 10/1994 |

(Continued)

*Primary Examiner* — Keath Chen
(74) *Attorney, Agent, or Firm* — Volpe and Koenig, P.C.

(57) ABSTRACT

There is provided a substrate processing apparatus. The substrate processing apparatus includes a processing space configured to process a substrate placed on a substrate receiving surface on a substrate support, a gas supply system configured to supply gases into the processing space from the opposite side of the substrate receiving surface, an exhaust buffer chamber including a communication hole communicating with the processing space at least at a side portion of the processing space and a gas flow blocking wall extending in a blocking direction of the gases flowing through the communication hole, and a first heating element configured to heat the exhaust buffer chamber.

9 Claims, 6 Drawing Sheets

(56) References Cited

U.S. PATENT DOCUMENTS

| | | | |
|---|---|---|---|
| 2004/0028810 A1* | 2/2004 | Grant | C23C 16/4412 427/248.1 |
| 2005/0208217 A1* | 9/2005 | Shinriki | C23C 16/34 427/248.1 |
| 2006/0213438 A1* | 9/2006 | Ishizaka | C23C 16/4404 118/715 |
| 2007/0116873 A1 | 5/2007 | Li et al. | |
| 2007/0221130 A1 | 9/2007 | Nozawa et al. | |
| 2007/0259110 A1* | 11/2007 | Mahajani | C23C 16/45508 427/248.1 |
| 2009/0004383 A1* | 1/2009 | Kadokura | C07F 17/00 427/248.1 |
| 2010/0310772 A1* | 12/2010 | Tsuda | C23C 16/409 427/255.28 |

FOREIGN PATENT DOCUMENTS

| | | |
|---|---|---|
| JP | 08-124866 A | 5/1996 |
| JP | 2006-319327 A | 11/2006 |
| JP | 2007-177323 A | 7/2007 |
| JP | 2009-224775 A | 10/2009 |
| JP | 2013-503464 A | 1/2013 |
| WO | 2005/117083 A1 | 12/2005 |

\* cited by examiner

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2014-172451, filed on Aug. 27, 2014, in the Japanese Patent Office, the entire contents of which are hereby incorporated by reference.

BACKGROUND OF THE DISCLOSURE

1. Field of the Disclosure

The present disclosure relates to a substrate processing apparatus and a method of manufacturing a semiconductor device and a non-transitory computer-readable recording medium thereof.

2. Description of the Related Art

In general, a substrate processing apparatus for performing processes (e.g., a film forming process) on a substrate (e.g., a wafer) is used in a process of manufacturing a semiconductor device. With the scaling-up of a substrate or an increase in the precision of processes, a single-wafer-type substrate processing apparatus configured to process substrates one by one has widely been used as the substrate processing apparatus.

To improve utilization efficiency of a process gas, the single-wafer-type substrate processing apparatus is configured to supply process gases into a processing space from an upper side of the processing surface of the substrate and discharge gases toward an outer circumferential side of the processing space. As the gases are exhausted toward the outer circumferential side of the processing space, an exhaust buffer chamber is disposed for exhausting gases uniformly.

Since some residual gases may be flowed into the exhaust buffer chamber, there is a possibility that some films may be deposited on the wall of the exhaust buffer chamber. The films which came off the wall of the exhaust buffer chamber, and flowed backward in the processing space, may cause the aggravation of film properties.

Therefore, this disclosure relates generally to the substrate processing apparatus which can form a film having excellent properties under employing the exhaust buffer chamber for exhausting gases, the method of manufacturing a semiconductor device and a non-transitory computer-readable recording medium thereof.

SUMMARY OF THE DISCLOSURE

According to the present disclosure, there is provided a substrate processing apparatus which includes a processing space configured to process a substrate placed on a substrate receiving surface, a gas supply system configured to supply gases into the processing space from the opposite side of the substrate receiving surface, an exhaust buffer chamber including a communication hole communicating with the processing space at least at a side portion of the processing space and a gas flow blocking wall extending in a blocking direction of the gases flowing through the communication hole, and a first heating element configured to heat the exhaust buffer chamber.

According to another aspect of the present disclosure, there is provided a method of manufacturing a semiconductor device including at least following steps, (a) placing a substrate on a substrate receiving surface of substrate support assembly in a processing space, (b) supplying a gas into the processing space from the opposite side of the substrate receiving surface, and (c) heating a gas flow blocking wall extending in a blocking direction of the exhaust gases in an exhaust buffer chamber.

According to another aspect of the present disclosure, there is provided a program for manufacturing a semiconductor device by employing a substrate processing apparatus, the program causing the substrate processing apparatus to execute: (a) placing a substrate on a substrate receiving surface in a processing space; (b) supplying gases into the processing space through a side facing the substrate receiving surface with heating an exhaust buffer chamber including a communication hole communicating with the processing space at least at a side portion of the processing space and a gas flow blocking wall extending in a blocking direction of the gases flowing through the communication hole.

According to another aspect of the present disclosure, there is provided a non-transitory computer-readable recording medium storing program for manufacturing a semiconductor device by employing a substrate processing apparatus, the program causes the substrate processing apparatus to execute
(a) placing a substrate on a substrate receiving surface of substrate support assembly in a processing space, (b) supplying a gas into the processing space through a side facing the substrate receiving surface, and (c) heating a gas flow blocking wall extending in a blocking direction of the exhaust gases in an exhaust buffer chamber.

According to this disclosure, when gases are exhausted by employing the exhaust buffer chamber, a film having good properties can be formed.

DETAILED DESCRIPTION OF THE PREFERRED EMBODIMENTS

<One Embodiment of the Present Disclosure>
One embodiment of the present disclosure will now be described with reference to the accompanying drawings.

(1) Structure of Substrate Processing Apparatus

A substrate processing apparatus according to the present embodiment is configured as a single-wafer-type substrate processing apparatus for processing substrates serving as processing objects one by one. As the substrates serving as the processing objects, for example, there may be a semiconductor wafer substrate (hereinafter, referred to simply as a "wafer") on which a semiconductor device is manufactured. Although processes performed on a substrate may include an etching process, an asking process and a film forming process, particularly, the film forming process will be described in the present embodiment. As a typical example of the film forming process, there is an alternate supply process.

Figure 1:
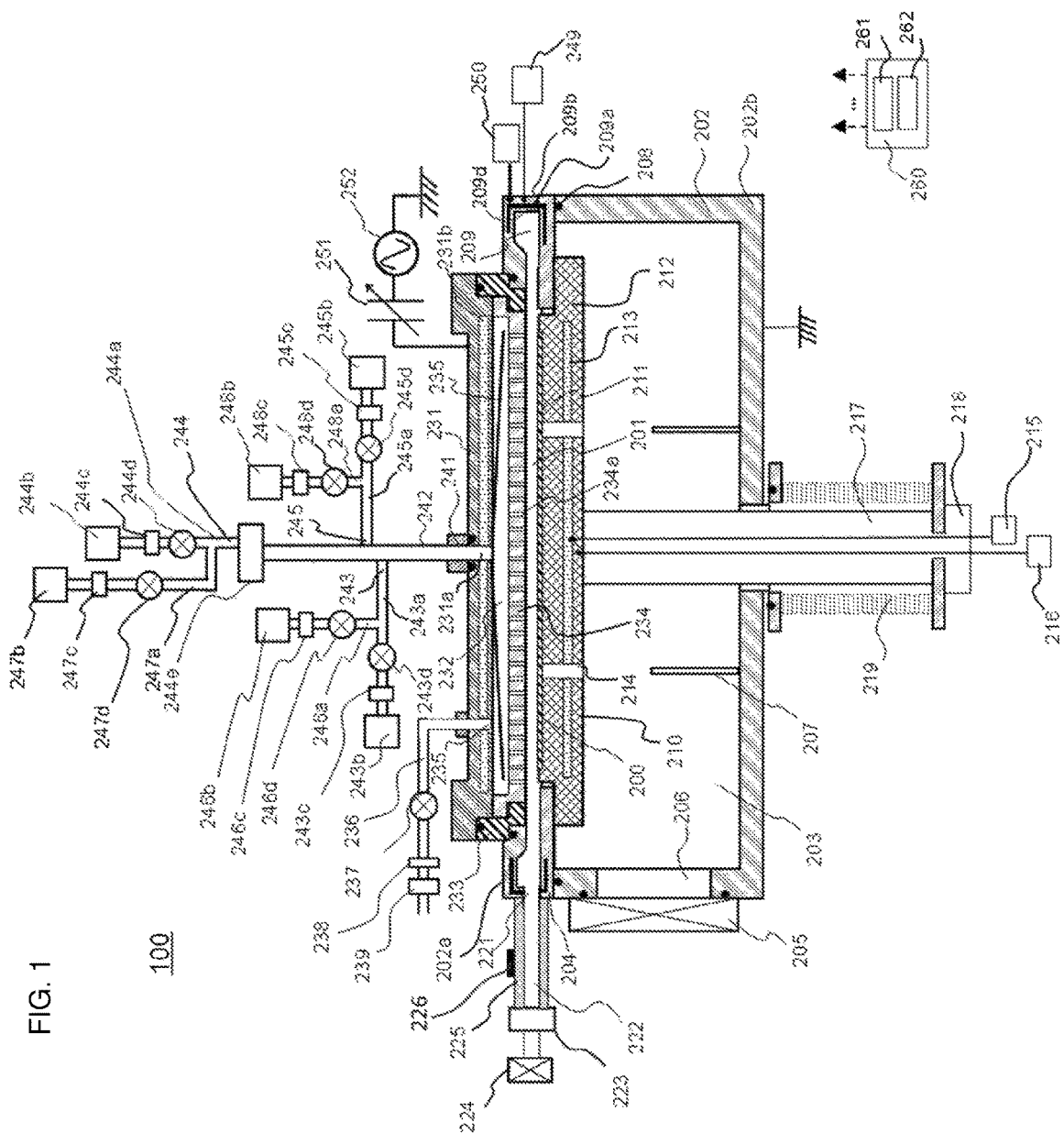
FIG. 1 is a schematic construction view of a single-wafer-type substrate processing apparatus according to an exemplary embodiment of the present disclosure.

Hereinafter, a structure of a substrate processing apparatus according to the present embodiment will be described with reference to FIG. 1. FIG. 1 is a schematic construction diagram of a single-wafer-type substrate processing apparatus according to the present embodiment.

(Process Container)

As illustrated in FIG. 1, a substrate processing apparatus 100 includes a process container 202. The process container 202 is configured as, for example, a planar airtight container having a circular cross-section. Also, the process container 202 is formed of a metal material, for example, aluminum (Al) or stainless steel (SUS). A processing space 201 for processing a wafer 200 (e.g., silicon wafer) serving as a substrate and a transfer space 203 through which the wafer 200 passes when the wafer 200 is transferred to the processing space 201 are formed in the process container 202. The process container 202 includes an upper container 202a and a lower container 202b. A partition plate 204 is installed between the upper container 202a and the lower container 202b.

An exhaust buffer chamber 209 is formed along a peripheral edge of an outer circumference of the inside of the upper container 202a. Heater 209a to heat at least an inside wall of the exhaust buffer chamber may be embedded in a wall of the exhaust buffer chamber. The exhaust buffer chamber 209 will be described in detail below.

A substrate loading/unloading port 206 is installed in a side surface of the lower container 202b and adjacent to a gate valve 205, and the wafer 200 is transferred between the lower container 202b and a transfer chamber (not shown) via the substrate loading/unloading port 206. A plurality of lift pins 207 are installed on a bottom portion of the lower container 202b. Also, the lower container 202b is grounded.

(Substrate Support Assembly)

A substrate support assembly 210 for supporting the wafer 200 is installed in the processing space 201. The substrate support assembly 210 mainly includes a substrate receiving surface 211 for placing the wafer 200, a substrate support 212 having the substrate receiving surface 211 disposed on a surface thereof, and a heater 213 embedded in the substrate support 212 and serving as a second heating source. Through holes 214 through which the lift pins 207 pass are respectively installed in positions corresponding to the lift pins 207.

The substrate support 212 is supported by a shaft 217. The shaft 217 penetrates a bottom portion of the process container 202 and is connected to an elevating mechanism 218 outside the process container 202. By lowering/elevating the shaft 217 and the substrate support 212 by operating the elevating mechanism 218, the wafer 200 placed on the substrate receiving surface 211 may be lowered/elevated. Also, the circumference of a lower end portion of the shaft 217 is coated with a bellows 219, and the inside of the process container 202 is air-tightly retained.

The substrate support 212 is lowered during the transfer of the wafer 200 until the substrate receiving surface 211 is in a position (wafer transfer position) opposite to the substrate loading/unloading port 206. During the processing of the wafer 200, the substrate support 212 is elevated until the wafer 200 is in a process position (wafer process position) of the processing space 201 as shown in FIG. 1. Specifically, when the substrate support 212 is lowered to the wafer transfer position, upper end portions of the lift pins 207 protrude from a top surface of the substrate receiving surface 211 so that the lift pins 207 can support the wafer 200 from below. Also, when the substrate support 212 is elevated to the wafer process position, the lift pins 207 are buried from the top surface of the substrate receiving surface 211 so that the substrate receiving surface 211 can support the wafer 200 from below. Also, since the lift pins 207 are in direct contact with the wafer 200, the lift pins 207 are preferably formed of a material, for example, quartz or alumina.

(Shower Head)

A shower head 230 is installed in an upper portion of the processing space 201 (at an upstream side in a gas supply direction) and serves as a gas dispersion mechanism. A gas introduction port 241 is installed at a lid 231 of the shower head 230, and a gas supply system which will be described below is connected to the gas introduction port 241. Gases introduced through the gas introduction port 241 are supplied to a buffer space 232 of the shower head 230.

The lid 231 of the shower head 230 is formed of a conductive metal and used as an electrode for generating plasma in the buffer space 232 or in the processing space 201. An insulating block 233 is installed between the lid 231 and the upper container 202a and electrically insulates the lid 231 from the upper container 202a.

The shower head 230 includes a dispersion plate 234 for dispersing gases supplied via the gas introduction port 241 through the gas supply system. An upstream side of the dispersion plate 234 is the buffer space 232, and a downstream side thereof is the processing space 201. The plurality of through holes 234a are installed in the dispersion plate 234. The dispersion plate 234 faces the substrate receiving surface 211.

A gas guide 235 for forming the flow of supplied gases is installed in the buffer space 232. The gas guide 235 has a circular conic shape having the gas introduction port 241 as an apex, and the diameter of the gas guide 235 increases toward the dispersion plate 234. A lower end of the gas guide 235 is formed further outward from a group of the through holes 234a formed at an outermost circumferential side of the dispersion plate 234.

(Plasma Generation Assembly)

A matcher 251 and a radio-frequency (RF) power source 252 are connected to the lid 231 of the shower head 230. By adjusting an impedance using the RF power source 252 and the matcher 251, plasma is generated in the shower head 230 and the processing space 201.

(Gas Supply System)

A common gas supply pipe 242 is connected to the gas introduction port 241 installed at the lid 231 of the shower head 230. The common gas supply pipe 242 is connected to the gas introduction port 241 and communicates with the buffer space 232 in the shower head 230. A first gas supply pipe 243a, a second gas supply pipe 244a and a third gas supply pipe 245a are connected to the common gas supply pipe 242. The second gas supply pipe 244a is connected to the common gas supply pipe 242 via a remote plasma assembly (RPU) 244e.

A source gas is mainly supplied through a source gas supply system 243 including the first gas supply pipe 243a, and a reactive gas is mainly supplied through a reactive gas supply system 244 including the second gas supply pipe 244a. An inert gas is mainly supplied when the wafer 200 is processed using a purge gas supply system 245 including the third gas supply pipe 245a, and a cleaning gas is mainly supplied when the shower head 230 or the processing space 201 is cleaned. Among gases supplied through the gas supply system, the source gas may be referred to as a first gas, the reactive gas may be referred to as a second gas, the inert gas may be referred to as a third gas, and the cleaning gas [for the processing space 201] may be referred to as a fourth gas.

(Source Gas Supply System)

A source gas supply source 243b, a mass flow controller (MFC) 243c which is a flow rate control device (flow rate control assembly), and a valve 243d which is an opening/closing valve are sequentially installed at the first gas supply pipe 243a in an upstream direction. Also, a source gas is supplied through the first gas supply pipe 243a via the MFC 243c, the valve 243d and the common gas supply pipe 242 into the shower head 230.

The source gas is one of process gases, for example, disilicon hexachloride or hexachlorodisilane gas (i.e., $Si_2Cl_6$ gas), which is a source containing silicon (Si). Also, the source gas may be any one of a solid, a liquid and a gas at normal temperature and pressure. When the source gas is a liquid at normal temperature and pressure, a vaporizer (not shown) may be installed between the source gas supply source 243b and the MFC 243c. Here, an example in which the source gas is a gas will be described.

The source gas supply system 243 is mainly configured by the first gas supply pipe 243a, the MFC 243c and the valve 243d. Also, the source gas supply system 243 may include the source gas supply source 243b and a first inert gas supply system which will be described below. Since the source gas supply system 243 supplies a source gas, which is one of process gases, the source gas supply system 243 corresponds to one of process gas supply systems.

A downstream end of a first inert gas supply pipe 246a is connected to the first gas supply pipe 243a at a downstream side of the valve 243d. An inert gas supply source 246b, an MFC 246c which is a flow rate control device (flow rate control assembly), and a valve 246d which is an opening/closing valve are sequentially installed at the first inert gas supply pipe 246a in an upstream direction. An inert gas is supplied through the first inert gas supply pipe 246a via the MFC 246c, the valve 246d and the first gas supply pipe 243a into the shower head 230.

The inert gas acts as a carrier gas for a source gas, and a gas which does not react with a source is preferably used as the inert gas. Specifically, the inert gas may be, for example, nitrogen ($N_2$) gas. In addition to $N_2$ gas, a rare gas, such as helium (He) gas, neon (Ne), gas, argon (Ar) gas, etc., may be used.

A first inert gas supply system is mainly configured by the first inert gas supply pipe 246a, the MFC 246c and the valve 246d. Also, the first inert gas supply system may include the inert gas supply source 246b and the first gas supply pipe 243a. The first inert gas supply system may be included in the source gas supply system 243.

(Reactive Gas Supply System)

The RPU 244e is installed at a downstream side of the second gas supply pipe 244a. A reactive gas supply source 244b, an MFC 244c which is a flow rate control device (flow rate control assembly), and a valve 244d which is an opening/closing valve are sequentially installed at an upstream side of the second gas supply pipe 244a in an upstream direction. A reactive gas is supplied through the second gas supply pipe 244a via the MFC 244c, the valve 244d, the RPU 244e and the common gas supply pipe 242 into the shower head 230. The reactive gas is put into a plasma state by the RPU 244e and radiated onto the wafer 200.

The reactive gas is one of process gases. For example, ammonia ($NH_3$) gas is used as the reactive gas.

The reactive gas supply system 244 is mainly configured by the second gas supply pipe 244a, the MFC 244c and the valve 244d. Also, the reactive gas supply system 244 may include the reactive gas supply source 244b, the RPU 244e and a second inert gas supply system which will be described below. Since the reactive gas supply system 244 supplies the reactive gas, which is one of the process gases, the reactive gas supply system 244 corresponds to another one of the process gas supply systems.

A downstream side of a second inert gas supply pipe 247a is connected to the second gas supply pipe 244a at a downstream side of the valve 244d. An inert gas supply source 247b, an MFC 247c which is a flow rate control device (flow rate control assembly), and a valve 247d which is an opening/closing valve are sequentially installed at the second inert gas supply pipe 247a in an upstream direction. Also, an inert gas is supplied through the second inert gas supply pipe 247a via the MFC 247c, the valve 247d, the second gas supply pipe 244a and the RPU 244e into the shower head 230.

The inert gas acts as a carrier gas or a dilution gas for a reactive gas. Specifically, the inert gas may be, for example, nitrogen ($N_2$) gas. In addition to $N_2$ gas, a rare gas, such as He gas, Ne, gas, Ar gas, etc., may be used.

The second inert gas supply system is mainly configured by the second inert gas supply pipe 247a, the MFC 247c and the valve 247d. Also, the second inert gas supply system may include the inert gas supply source 247b, the second gas supply pipe 244a and the RPU 244e. The second inert gas supply system may be included in the reactive gas supply system 244.

(Purge Gas Supply System)

A purge gas supply source 245b, an MFC 245c which is a flow rate control device (flow rate control assembly), and a valve 245d which is an opening/closing valve are sequentially installed at the third gas supply pipe 245a in an upstream direction. In a substrate processing process, an inert gas serving as a purge gas is supplied through the third gas supply pipe 245a via the MFC 245c, the valve 245d and the common gas supply pipe 242 into the shower head 230. Also, in a processing space cleaning process, an inert gas serving as a carrier gas or dilution gas for a cleaning gas is supplied via the MFC 245c, the valve 245d and the common gas supply pipe 242 into the shower head 230 when necessary.

An inert gas supplied from the purge gas supply source 245b acts as a purge gas for purging gases remaining in the process container 202 or the shower head 230 in the substrate processing process. Also, the inert gas may act as a carrier gas or dilution gas for a cleaning gas in the processing space cleaning process. Specifically, the inert gas may be, for example, nitrogen ($N_2$) gas. In addition to $N_2$ gas, a rare gas, such as He gas, Ne, gas, Ar gas, etc., may be used.

The purge gas supply system 245 is mainly configured by the third gas supply pipe 245a, the MFC 245c and the valve 245d. Also, the purge gas supply system 245 may include the purge gas supply source 245b and a processing space cleaning gas supply system which will be described below.

(Processing Space Cleaning Gas Supply System)

A downstream side of a processing space cleaning gas supply pipe 248a is connected to the third gas supply pipe 245a at a downstream side of the valve 245d. A processing space cleaning gas supply source 248b, an MFC 248c which is a flow rate control device (flow rate control assembly), and a valve 248d which is an opening/closing valve are sequentially installed at the processing space cleaning gas supply pipe 248a in an upstream direction. In the processing space cleaning process, a cleaning gas is supplied through the third gas supply pipe 245a via the MFC 248c, the valve 248d and the common gas supply pipe 242 into the shower head 230.

The cleaning gas supplied from the processing space cleaning gas supply source 248b acts as a cleaning gas for removing byproducts adhered to the shower head 230 or the process container 202 in the processing space cleaning process. Specifically, for example, nitrogen trifluoride ($NF_3$) gas may be used as the cleaning gas. Also, for example, hydrogen fluoride (HF) gas, chlorine trifluoride ($ClF_3$) gas, fluorine ($F_2$) gas, and a combination thereof may be used as the cleaning gas.

The processing space cleaning gas supply system is mainly configured by the processing space cleaning gas supply pipe 248a, the MFC 248c and the valve 248d. Also, the processing space cleaning gas supply system may include the processing space cleaning gas supply source 248b and the third gas supply pipe 245a. The processing space cleaning gas supply system may be included in the purge gas supply system 245.

(Gas Exhaust System)

An exhaust system to exhaust an atmosphere in the process container 202 may include a plurality of exhaust pipes connected to the process container 202. Specifically, the exhaust system may include a first exhaust pipe (not shown) connected to the transfer space 203 in the lower container 202b, a second exhaust pipe 222 connected to the exhaust buffer chamber 209 of the upper container 202a, and a third exhaust pipe 236 connected to the buffer space 232 in the shower head 230. Heater 225 as a third heater and a thermocouple 226 for detecting a temperature of the second exhaust pipe 222 may be attached to the second exhaust pipe 222. Heater 225 may be controlled to generate heat becoming the temperature that gas flowing through the pipe does not deposit the wall.

(First Gas Exhaust System)

The first exhaust pipe (not shown) is connected to a side surface of the transfer space 203. A turbo molecular pump (TMP, not shown) which is a vacuum pump for realizing a high vacuum or ultrahigh vacuum is installed at the first exhaust pipe.

Also, a valve as a first exhaust valve for the transfer space 203 is installed at an upstream side of the TMP in the first exhaust pipe. A valve is also installed at a downstream side of the TMP in the first exhaust pipe. A dry pump (DP) (not shown) may be installed together with the TMP at the first exhaust pipe. When the TMP operates, the DP functions as a subsidiary pump of the TMP. That is, the TMP and the DP exhaust an atmosphere of the transfer space 203 via the first exhaust pipe. At this time, since it is difficult for the TMP alone, which is a high vacuum (or ultrahigh vacuum) pump, to exhaust the atmosphere of the transfer space 203 to an atmospheric pressure, the DP is used as the subsidiary pump configured to exhaust the atmosphere of the transfer space 203 to the atmospheric pressure.

A first gas exhaust system is mainly configured by the first exhaust pipe and the valves. The TMP and the DP may be also included to the first gas exhaust system.

(Second Gas Exhaust System)

The second exhaust pipe 222 is connected to the inside of the exhaust buffer chamber 209 via an exhaust hole 221 opened at the upper wall or the side wall which forms a part of the exhaust buffer chamber 209. An auto pressure controller (APC) 223 serving as a pressure control device for controlling the inside of the processing space 201, which communicates with the exhaust buffer chamber 209, to a predetermined pressure is installed at the second exhaust pipe 222. The APC 223 includes a valve body (not shown) of which an opening rate may be adjusted, and adjusts a conductance of the second exhaust pipe 222 in response to an instruction from a controller 260 which will be described below. A vacuum pump 224 is installed at the second exhaust pipe 222 at a downstream side of the APC 223. The vacuum pump 224 exhausts an atmosphere of the exhaust buffer chamber 209 and an atmosphere of the processing space 201 which communicates with the exhaust buffer chamber 209, via the second exhaust pipe 222. Also, valves (not shown) are installed at the second exhaust pipe 222 at a downstream side of the APC 223, an upstream side of the APC 223, or both sides thereof.

A second gas exhaust system is mainly configured by the second exhaust pipe 222, the APC 223, the vacuum pump 224 and a valve (not shown). Also, the vacuum pump 224 may use the DP in common with the first gas exhaust system.

(Third Gas Exhaust System)

The third exhaust pipe 236 is connected to a top surface or side surface of the buffer space 232. That is, the third exhaust pipe 236 is connected to the shower head 230 and thus, communicates with the buffer space 232 of the shower head 230. A valve 237 is installed at the third exhaust pipe 236. Also, a pressure adjustor 238 is installed at the third exhaust pipe 236 at a downstream side of the valve 237. A vacuum pump 239 is installed at the third exhaust pipe 236 at a downstream side of the pressure adjustor 238. The vacuum pump 239 exhausts an atmosphere of the buffer space 232 via the third exhaust pipe 236.

A third gas exhaust system is mainly configured by the third exhaust pipe 236, the valve 237, the pressure adjustor 238 and the vacuum pump 239. Also, the vacuum pump 239 may use the DP in common with the first gas exhaust system.

A dry pump (DP) (not shown) may be installed at a downstream side of the first exhaust pipe, second exhaust pipe 222 or third exhaust pipe 236. Each of the DP may exhaust an atmosphere of the buffer space 232, processing space 201 or transfer space 203 respectively, via the first exhaust pipe, second exhaust pipe 222 or third exhaust pipe 236. When the TMP operates, the DP functions as a subsidiary pump of the TMP. Since it is difficult for the TMP alone, which is a high vacuum (or ultrahigh vacuum) pump, to exhaust the atmosphere of the space to an atmospheric pressure, the DP is used as the subsidiary pump configured to exhaust the atmosphere of the space to the atmospheric pressure.

(Controller)

The substrate processing apparatus 100 includes the controller 260 configured to control an operation of each of constitutional elements of the substrate processing apparatus 100. The controller 260 includes at least an operation assembly 261 and a memory assembly 262. The controller 260 is connected to each of the constitutional elements, calls a program or recipe from the memory assembly 262 in response to an instruction from the controller 260 or a user, and controls the operation of each of the constitutional elements according to the contents of the program or the recipe. Specifically, the controller 260 is configured to control operations of the gate valve 205, the elevating mechanism 218, the heater 213, a radio-frequency (RF) power source 252, the matcher 251, the MFC 243c, 244c, 245c, 246c, 247c, 248c, the valve 243d, 244d, 245d, 246d, 247d, 248d, the APC 223, the TMP, the DP, the vacuum pumps 224 and 239, the valve 237, etc.

The controller 260 may be configured as a dedicated computer or configured as a general-purpose computer. For example, the controller 260 according to the present embodiment may be configured by preparing an external memory device storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.), and then installing the program in a general-purpose computer using the external memory device.

In addition, means for supplying a program to a computer are not limited to using the external memory device. For example, a program may be supplied to a computer using communication means, e.g., the Internet or an exclusive line, without using the external memory device. The memory assembly 262 or the external memory device may be configured as a non-transitory computer-readable recording medium. Hereinafter, the memory assembly 262 and the external memory device may also be referred to together simply as a 'recording medium.' Also, when the term 'recording medium' is used in the present disclosure, it may be understood as only the memory assembly 262, only the external memory device, or both the memory assembly 262 and the external memory device.

(2) Details of Exhaust Buffer Chamber

Here, the exhaust buffer chamber 209 formed in the upper container 202a of the process container 202 will be described in detail with reference to FIG. 2 and FIG. 3.

Figure 2:
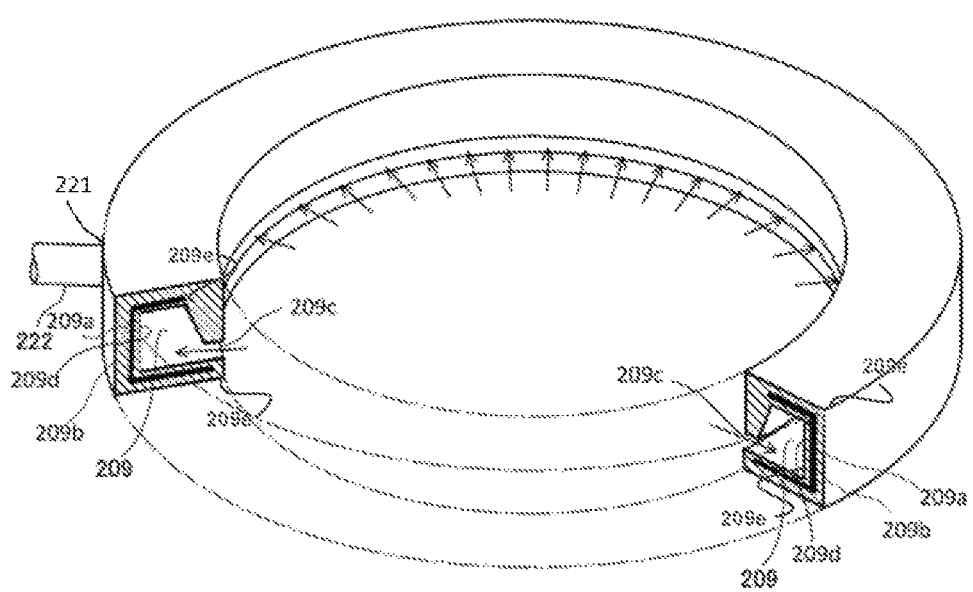
FIG. 2 is a schematic perspective view of an example of the overall shape of an exhaust buffer chamber of the substrate processing apparatus of FIG. 1.

FIG. 2 is a schematic perspective view of an example of the overall shape of an exhaust buffer chamber of the substrate processing apparatus of FIG. 1. FIG. 3 is a schematic side-sectional view of an example of a sectional shape of the exhaust buffer chamber of the substrate processing apparatus of FIG. 1.

(Overall Shape)

The exhaust buffer chamber 209 may function as a buffer space when gases in the processing space 201 are discharged toward outside of the processing space 201. Thus, the exhaust buffer chamber 209 may include a space surrounding an outer circumference of the processing space 201 as shown in FIG. 2. That is, in a plan view, the exhaust buffer chamber 209 may be a ring shape, in other word, annular shape surrounding the processing space 201.

(Sectional Shape)

Figure 3:
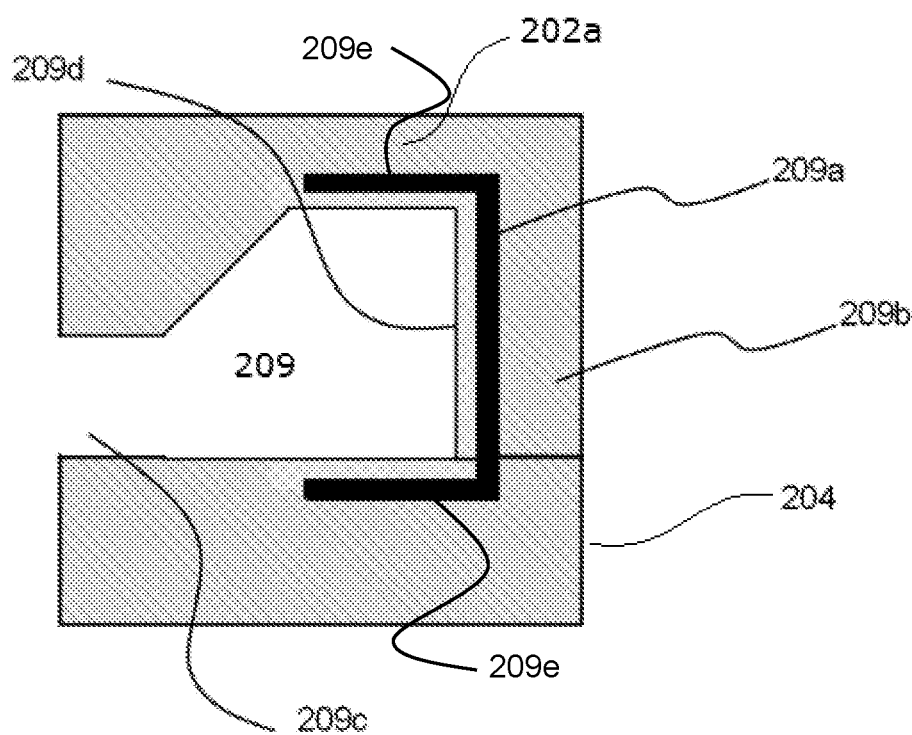
FIG. 3 is a schematic side-sectional view of an example of a sectional shape of the exhaust buffer chamber of the substrate processing apparatus of FIG. 1.

In a partial sectional shape of the exhaust buffer chamber 209 as shown in FIG. 3, the exhaust buffer chamber 209 may be formed by an upper wall as a ceiling and side walls of upper container 202a and the partition plate 204 as a bottom wall. In addition, a communication slit 209c which communicates with the processing space 201 is opened at an inner circumferential side of the exhaust buffer chamber 209. The gas supplied into the processing space 201 is discharged into the exhaust buffer chamber 209 through the communication slit 209c. Most of the gas discharged into the exhaust buffer chamber 209 may collide with one side wall of the exhaust buffer chamber 209, disposed at the opposite position of the communication slit 209c. This side wall is called a gas flow blocking wall 209b. The gas flow blocking wall 209b is extending along the inner circumferential side of the exhaust buffer chamber 209 so as to block the flow of exhaust gas, the gas flow blocking wall 209b being disposed in the direction that is at least not parallel to the flow of the exhaust gas flown into the exhaust buffer chamber 209. For example, the gas flow blocking wall 209b may stand perpendicularly to the horizontal gas flow as shown FIG. 3.

Since the exhaust buffer chamber 209 surrounds the outer circumference of the processing space 201, it is preferable that the communication slit 209c also surrounds the outer circumference of the processing space 201 entirely. In this case, in consideration that the exhaust buffer chamber 209 functions as a buffer space for exhausting gases, the vertical length of the communication slit 209c is preferably less than the vertical length of the exhaust buffer chamber 209. By narrowing the width of the communication slit 209c in comparison with the capacity of the exhaust buffer chamber 209, the conductance in the exhaust buffer chamber 209 can become larger than that of the processing space 201.

(Connection in the Exhaust System)

As shown in FIGS. 1 and 2, the second exhaust pipe 222 of the second gas exhaust system is connected to the exhaust buffer chamber 209 via an exhaust hole 221. The gas in the processing space 201 may flow into the exhaust buffer chamber 209 through the communication slit 209c. Then, the gas in the exhaust buffer chamber 209 may be exhausted to outside of the exhaust buffer chamber through the second exhaust pipe 222 via the exhaust hole 221 (refer to arrows of FIG. 2). In this way, the gas of the processing space 201 may be rapidly exhausted. It is preferable that the exhaust hole 221 is opened in the gas flow blocking wall 209b arranged in the direction that is at least not parallel to the flow of the exhaust gas. In this way, as the gas flow pass from the communication slit 209c to the exhaust hole 221 is arranged horizontally, the gas of the processing space 201 may be rapidly exhausted. In another example, the exhaust hole 221 can be opened in the wall that is not parallel to the flow of the exhaust gas, for example, the exhaust hole 221 can be opened in the upper wall as a ceiling of the exhaust buffer chamber 209. In such a case, the upper wall of the exhaust buffer chamber 209 corresponds to the gas flow blocking wall 209b because the gas flow pass from the communication slit 209c is bent to the exhaust hole 221.

(Heater for Heating the Exhaust Buffer Chamber)

Figure 6:
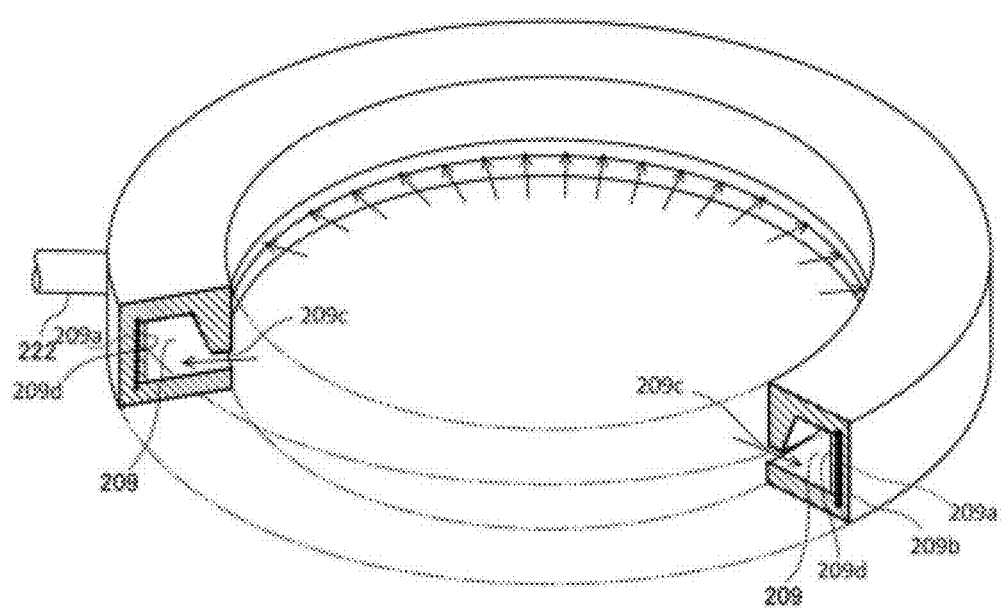
FIG. 6 is a schematic perspective view of another example of the overall shape of an exhaust buffer chamber of the substrate processing apparatus of FIG. 2.

Heater 209a as a first heater may be embedded in the wall facing the exhaust gas flown in the exhaust buffer chamber 209 via the communication slit 209c. An inside wall of the exhaust buffer chamber 209 may block the principal flow of the exhaust gas. In other words, such an inside wall is referred as the gas flow blocking wall 209b. Heater 209a may be embedded in the gas flow blocking wall 209b along circumference of the exhaust buffer chamber 209. Heater controller 249 may be connected to heater 209a through a power supply line. Heater controller 249 may control the supply of the power to heater 209a and thereby may control temperature of heater 209a. Heater 209a may be configured to heat at least an inner circumferential surface 209d of the gas flow blocking wall 209b which may be exposed to exhaust gas mostly. Since much quantity of gases may be exhausted through the communication slit 209c, it is very likely to deposit the gases on the inner circumferential surface 209d of the gas flow blocking wall 209b. FIG. 6 illustrates the example of configuration that heater 209a is embedded in only the gas flow blocking wall 209b, along circumference of the exhaust buffer chamber 209. In case shown in FIG. 6, since the gas is exhausted horizontally from the communication slit 209c to the second exhaust pipe 222, a wall disturbing a horizontal gas flow corresponds to the gas flow blocking wall 209b. In another example that the exhaust hole 221 is opened in the upper wall, the gas flow pass from the communication slit 209c to the exhaust hole 221 is bent, then the main flow of the gas may be sprayed inside of an upper wall of the exhaust buffer chamber 209. In the walls which form the exhaust buffer chamber 209, the wall having an exhaust hole 221 corresponds to the gas flow blocking wall 209b.

In addition, another heater 209e can be embedded in the wall except the gas flow blocking wall 209b. As shown in FIG. 1, a heater 209e may be embedded in an upper wall or a bottom wall of exhaust buffer chamber 209. A heater 209e may also be embedded in both the upper wall and the bottom wall of exhaust buffer chamber 209. In these cases, the temperature of the gas flow blocking wall 209b, the upper wall or the bottom wall may be controlled respectively. By controlling the temperature of each wall, heating control depending on quantity of the deposition on each wall is enabled. For example, the temperature of the upper wall or bottom wall may be set to more than the temperature that gases may become self-decomposition and form a film. And the temperature of the gas flow blocking wall 209b may be set more highly than the temperature of the upper wall or bottom wall. In assuming it high temperature, as a film having a more dense structure and uniform film stress can be formed, physical detachment of the film from the wall can be controlled even if gases collided with the gas flow blocking wall 209b. In addition, in the case of upper wall or bottom wall, since the probability that a large quantity of gas collides with those walls directly is low, the film stress may be allowed to become weaker, specifically, the density of the film may be allowed lower than that the film formed on the gas flow blocking wall 209b.

In order that forming a film is enable under the condition that the temperature of the gas flow blocking wall 209b is decreased by the gases which collided with that wall, the temperature of the gas flow blocking wall 209b may be controlled to the temperature that may compensate for a drop of the temperature and keep the condition being able to form a film. In this way, even if the temperature of the gas flow blocking wall 209b become lower by gases which collided with that wall, the temperature to form a film can be maintained.

Heater 209a may be configured to set higher temperature than heater 213 embedded in the substrate support 212. In other words, heater 209a may be configured to heat at least the inner circumferential surface 209d of the gas flow blocking wall 209b to the temperature that is higher than the temperature of the inner walls defining the processing space.

(3) Substrate Processing Process

Next, a process of forming a thin film on the wafer 200 using the substrate processing apparatus 100 will be described as one process of a method of manufacturing a semiconductor device. In the following description, an operation of each of constitutional elements of the substrate processing apparatus 100 is controlled by the controller 260.

Here, an example in which a silicon nitride (SiN) film is formed as a silicon-containing film on the wafer 200 by means of an alternate supply method using $Si_2Cl_6$ gas as a source gas (first process gas) and $NH_3$ gas as a reactive gas (second process gas) will be described.

Figure 4:
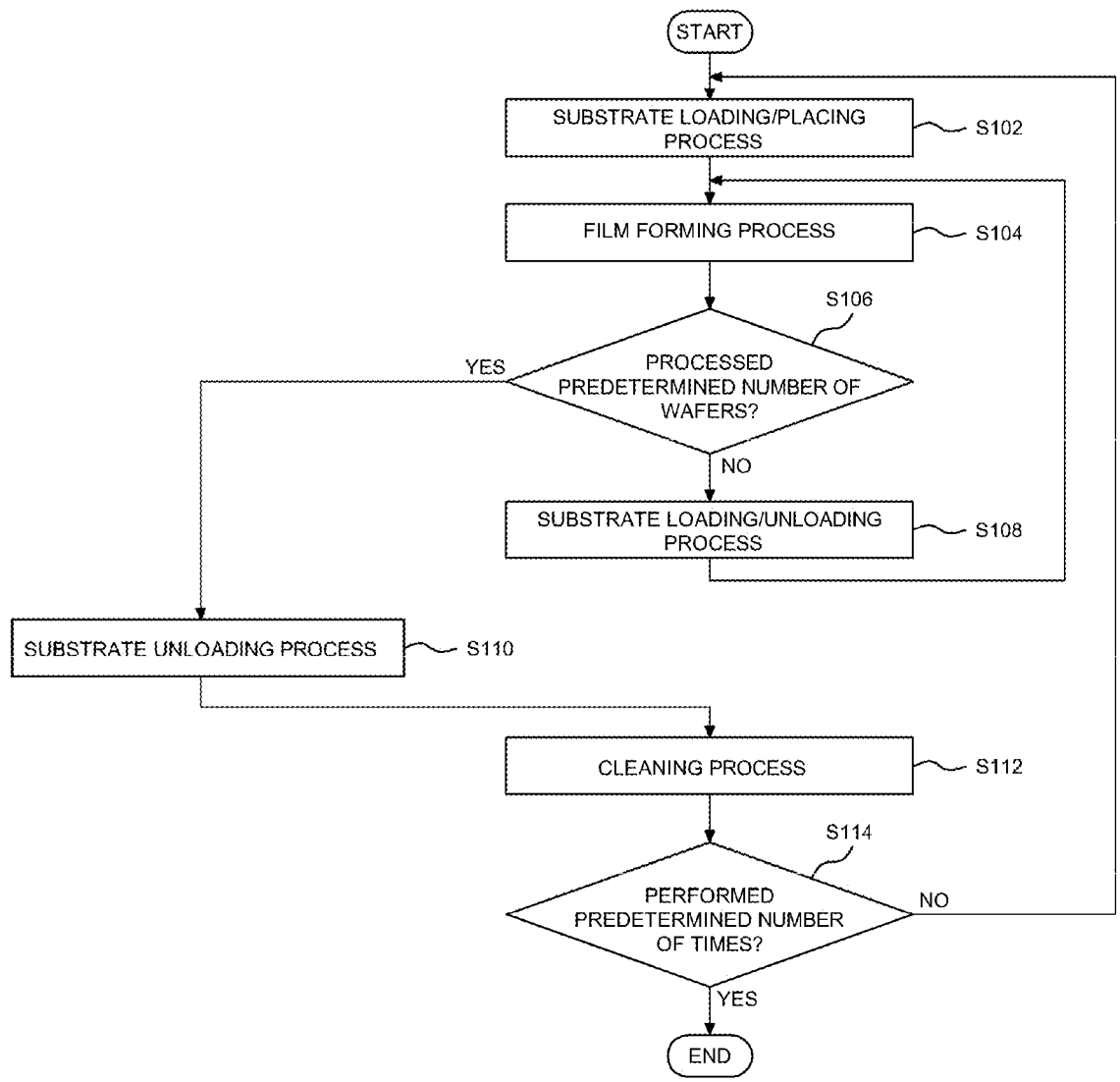
FIG. 4 is a flowchart illustrating a substrate processing process and a cleaning process according to an exemplary embodiment of the present disclosure.
Figure 5:
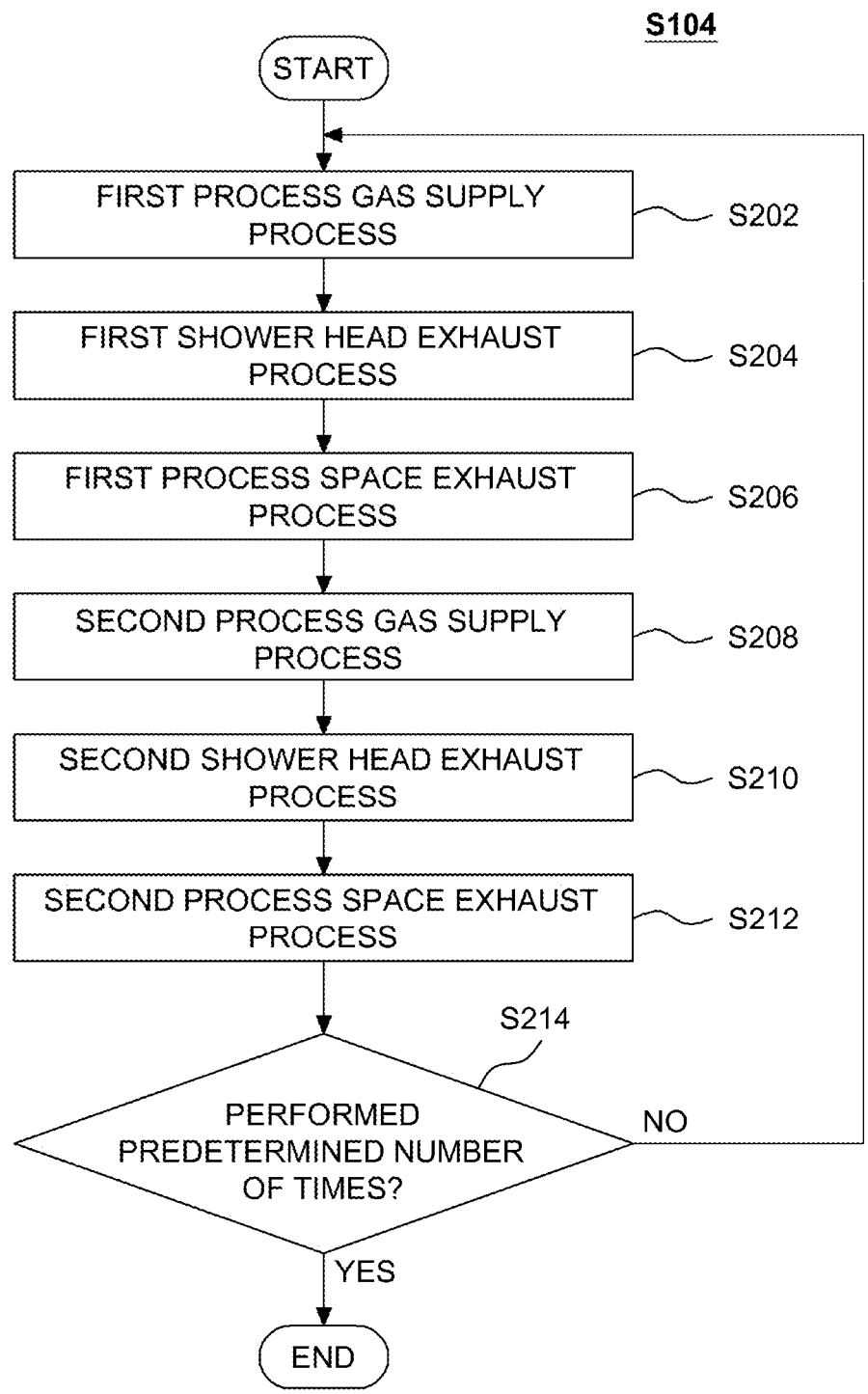
FIG. 5 is a detailed flowchart illustrating a film forming process of FIG. 5.

FIG. 4 is a flowchart illustrating a substrate processing process and a cleaning process according to the present embodiment. FIG. 5 is a detailed flowchart of a film forming process shown in FIG. 4.

(Substrate Loading/Placing Process S102)

In the substrate processing apparatus 100, the lift pins 207 penetrate the through holes 214 of the substrate support 212 by lowering the substrate support 212 to the transfer position of the wafer 200. As a result, the lift pins 207 protrude only a predetermined height from the surface of the substrate support 212. Subsequently, the gate valve 205 is opened so that the transfer space 203 may communicate with a carry chamber (not shown). The wafer 200 is loaded from the carry chamber into the transfer space 203 using a wafer carrier (not shown), and then carried onto the lift pins 207. Thus, the wafer 200 is supported in a horizontal posture on the lift pins 207 protruding from the surface of the substrate support 212.

When the wafer 200 is loaded into the process container 202, the wafer carrier escapes from the process container 202, and the gate valve 205 is closed to air-tightly close the inside of the process container 202. Thereafter, the wafer 200 is placed on the substrate receiving surface 211 installed on the substrate support 212 by elevating the substrate support 212. Also, the wafer 200 is elevated to the above-described process position of the processing space 201 by elevating the substrate support 212.

When the wafer 200 is loaded into the process container 202, the valve of the first gas exhaust system is put into an open state (is opened), so that the transfer space 203 may communicate with the TMP and the TMP may communicate with the DP. Meanwhile, the valves of the exhaust system other than the valve of the first gas exhaust system are put into a closed state (are closed). Thus, an atmosphere of the transfer space 203 is exhausted due to the TMP and the DP, and the process container 202 reaches a high vacuum (ultrahigh vacuum) state (e.g., a pressure of $10^{-5}$ Pa or less). During the current process, the process container 202 is put into a high vacuum (ultrahigh vacuum) state to reduce a difference in pressure between the process container 202 and the carry chamber which is similarly maintained in a high vacuum (ultrahigh vacuum) state (e.g., a pressure of $10^{-6}$ Pa or less). In this state, the gate valve 205 is opened, and the wafer 200 is loaded from the carry chamber into the transfer space 203. Also, the TMP and the DP are continuously operated during the processes shown in FIGS. 5 and 6 not to cause a delay in a processing process due to rises in operations of the TMP and the DP.

After the wafer 200 is loaded into the transfer space 203, when the wafer 200 is elevated to the process position in the processing space 201, the valve of the first gas exhaust system is put into a closed state. Thus, the transfer space 203 is cut off from the TMP, so the exhaust of the transfer space 203 due to the TMP is ended. Meanwhile, the exhaust buffer chamber 209 communicates with the APC 223 by opening the valve of the second gas exhaust system, and also the APC 223 communicates with the vacuum pump 224. The APC 223 may adjust a conductance of the second exhaust pipe 222 and control the flow rate of gases exhausted from the exhaust buffer chamber 209 due to the vacuum pump 224, so that the processing space 201 which communicates with the exhaust buffer chamber 209 may be maintained under a predetermined pressure. Also, the valves of other exhaust systems are maintained in a closed state. Also, when the valves of the first gas exhaust system are closed off, an operation of the TMP is stably maintained by putting a valve disposed at the downstream side of the TMP into a closed state after putting a valve disposed at the upstream side of the TMP into a closed state.

During the above-described process, $N_2$ gas serving as an inert gas may be supplied into the process container 202 through the inert gas supply system while exhausting the inside of the process container 202. That is, while exhausting the inside of the process container 202 via the exhaust buffer chamber 209 using the TMP or DP, $N_2$ gas may be supplied into the process container 202 by opening at least the valve 245*d* of the third gas supply system. Thus, particles may be inhibited from being adhered onto the wafer 200.

In addition, when the wafer 200 is placed on the substrate support 212, power is supplied to the heater 213 embedded in the substrate support 212, and the surface of the wafer 200 is controlled to a predetermined processing temperature. In parallel with such processing, power is supplied to the heater 209*a* embedded in the exhaust buffer chamber 209, and the wall of the exhaust buffer chamber 209 is controlled to a predetermined temperature. In this case, a temperature of the heater 213 is adjusted by controlling an amount of current supplied into the heater 213 based on temperature information detected by a temperature sensor 216 and a temperature of the heater 209*a* is adjusted by controlling an amount of current supplied into the heater 209*a* based on temperature information detected by a temperature sensor 250. Furthermore, a temperature of the heater 225 is adjusted by controlling an amount of current supplied into the heater 225 based on temperature information detected by a temperature sensor 226.

Thus, in the substrate loading/placing process S102, the inside of the processing space 201 is controlled to a predetermined processing pressure and also, a temperature of the surface of the wafer 200 is controlled to a predetermined processing temperature. Furthermore, the temperature of the second exhaust pipe 222 may be controlled to the temperature that gases may not be deposited to the inner surface of the second exhaust pipe 222.

More preferably, the temperature of the wall of the exhaust buffer chamber 209 may be controlled to the higher temperature than that of the wafer 200. In this case, as the heater 209*a* may heat the circumference side of the substrate support 212, the heat escape from the circumference side of the substrate support 212 can be prevented.

Here, the predetermined processing temperature and the predetermined processing pressure are a processing temperature and a processing pressure at which an SiN film may be formed using an alternate supply method during a film forming process S104 which will be described below. That is, the predetermined processing temperature and the predetermined processing pressure are a processing temperature and a processing pressure at which a source gas supplied during a first process gas (source gas) supply process S202 does not self-decompose. Specifically, the processing temperature is in the range of room temperature to a temperature of about 500° C. and preferably, in the range of room temperature to a temperature of about 400° C., and the processing pressure is in the range of 50 Pa to 5000 Pa. The processing temperature and the processing pressure are maintained during the film forming process S104 which will be described below. In addition, the temperature in the exhaust buffer chamber 209 may be set more than the temperature that a source gas is decomposed itself. Specifically, the temperature in the exhaust buffer chamber 209 may be set more than 400 degrees Celsius and less than 700 degree Celsius. Furthermore, the temperature in the second exhaust pipe 222 may be set more than 200 degrees Celsius and less than 500 degree Celsius. In the process for forming an ultra-low temperature Oxide (ULTO) film, the temperature of the processing space 201 may be set more than room temperature and less than 300 degree Celsius, the temperature in the exhaust buffer chamber 209 may be set more than 100 degrees Celsius and less than 400 degree Celsius, the temperature in the second exhaust pipe 222 may be set more than 100 degrees Celsius and less than 300 degree Celsius. In the process for forming TiN, TiO, AlO, AlN, HfO or ZrO film, the temperature of the processing space 201 may be set more than room temperature and less than 400 degree Celsius, the temperature in the exhaust buffer chamber 209 may be set more than 200 degrees Celsius and less than 500 degree Celsius, the temperature in the second exhaust pipe 222 may be set more than 200 degrees Celsius and less than 400 degree Celsius.

(Film Forming Process S104)

After the substrate loading/placing process S102, the film forming process S104 is performed. Hereinafter, the film forming process S104 will be described in detail with reference to FIG. 5. Also, the film forming process S104 is a cyclic processing process of repeating a process of alternately supplying different process gases.

(First Process Gas Supply Process S202)

In the film forming process S104, a first process gas (source gas) supply process S202 is preferentially performed. When a first process gas is, for example, a liquid source such as $TiCl_4$, the source is vaporized to generate a source gas (i.e., $TiCl_4$ gas) (preliminary vaporization) in advance. The preliminary vaporization of the source gas may be performed simultaneously with the above-described substrate loading/placing process S102. This is because a predetermined time is required to stably generate the source gas.

When the first process gas is supplied, the supply of the source gas ($Si_2Cl_6$ gas) into the processing space 201 is started by opening the valve 243*d* and adjusting the MFC 243*c* such that the source gas has a predetermined flow rate. A supply flow rate of the source gas is in the range of, for example, 100 sccm to 500 sccm. The source gas is dispersed by the shower head 230 and uniformly supplied onto the wafer 200 in the processing space 201.

In this case, the valve 246*d* of the first inert gas supply system is opened, and an inert gas ($N_2$ gas) is supplied through the first inert gas supply pipe 246*a*. A supply flow rate of the inert gas is in the range of, for example, 500 sccm to 5000 sccm. Also, the inert gas may be supplied through the third gas supply pipe 245*a* of the purge gas supply system.

The remnant source gas is uniformly supplied from the processing space 201 into the exhaust buffer chamber 209, flows through the second exhaust pipe 222 of the second gas exhaust system, and is exhausted. Specifically, the valve of the second gas exhaust system is put into an open state, and a pressure of the processing space 201 is controlled by the APC 223 to be a predetermined pressure. Also, all the valves of the exhaust systems other than the valve of the second gas exhaust system are in a closed state.

At this time, a processing temperature and a processing pressure in the processing space 201 are a processing temperature and a processing pressure at which the source gas does not self-decompose. Accordingly, gas molecules of the source gas are adsorbed onto the wafer 200.

In the exhaust buffer chamber 209, as a result that the source gas is decomposed itself, a film containing the source materials may be formed on the inside wall of the exhaust buffer chamber 209.

After a predetermined time has elapsed since the supply of the source gas started, the valve 243*d* is closed off, and the supply of the source gas is stopped. A supply time of the source gas and the carrier gas is in the range of, for example, 2 seconds to 20 seconds.

(First Shower Head Exhaust Process S204)

After the supply of the source gas is stopped, an inert gas ($N_2$ gas) is supplied through the third gas supply pipe 245*a*, and the shower head 230 is purged. From among the valves of the gas exhaust system, the valve of the second gas exhaust system is put into a closed state, while the valve 237 of the third gas exhaust system is put into an open state. The valves of other gas exhaust system are in a closed state. That is, when the shower head 230 is purged, the exhaust buffer chamber 209 is cut off from the APC 223 to stop the control of pressure due to the APC 223, while the buffer space 232 communicates with the vacuum pump 239. Thus, the source gas remaining in the shower head 230 [buffer space 232] is exhausted by the vacuum pump 239 via the third exhaust pipe 236 through the shower head 230. At this time, the valve installed at a downstream side of the APC 223 may be opened.

A flow rate of the inert gas ($N_2$ gas) supplied during the first shower head exhaust process S204 is in the range of, for example, 1000 sccm to 10000 sccm. Also, a supply time of the inert gas is in the range of, for example, 2 seconds to 10 seconds.

(First Processing Space Exhaust Process S206)

When the purge of the shower head 230 ends, the processing space 201 is subsequently purged by supplying the inert gas ($N_2$ gas) through the third gas supply pipe 245a. At this time, the valve of the second gas exhaust system is put into an open state, and a pressure of the processing space 201 is controlled by the APC 223 to be a predetermined pressure. Meanwhile, all the valves of the exhaust systems other than the valve of the second gas exhaust system are put into a closed state. Thus, the source gas which has not been adsorbed to the wafer 200 during the first process gas supply process S202 is removed by the vacuum pump 224 of the second gas exhaust system from the processing space 201 via the second exhaust pipe 222 and the exhaust buffer chamber 209.

A supply flow rate of the inert gas ($N_2$ gas) during the first processing space exhaust process S206 is in the range of, for example, 1000 sccm to 10000 sccm. Also, a supply time of the inert gas is in the range of, for example, 2 seconds to 10 seconds.

Although the present embodiment has described an example in which the first processing space exhaust process S206 is performed after the first shower head exhaust process S204, the first shower head exhaust process S204 may be performed after the first processing space exhaust process S206. Also, the first shower head exhaust process S204 may be performed simultaneously with the first processing space exhaust process S206.

(Second Process Gas Supply Process S208)

When the purge of the shower head 230 and the processing space 201 is completed, a second process gas (reactive gas) supply process S208 is performed. During the second process gas supply process S208, the valve 244d is opened, and the supply of a reactive gas ($NH_3$ gas) via the RPU 244e and the shower head 230 into the processing space 201 starts. In this case, the MFC 244c is adjusted such that the reactive gas has a predetermined flow rate. A supply flow rate of the reactive gas is in the range of, for example, 1000 sccm to 10000 sccm.

A reactive gas in a plasma state is dispersed by the shower head 230 and uniformly supplied onto the wafer 200 in the processing space 201, and reacts with a source-gas-containing film adsorbed onto the wafer 200 to generate an SiN film on the wafer 200.

In this case, the valve 247d of the second inert gas supply system is opened, and the inert gas ($N_2$ gas) is supplied through the second inert gas supply pipe 247a. A supply flow rate of the inert gas is in the range of, for example, 500 sccm to 5000 sccm. Also, the inert gas may be supplied through the third gas supply pipe 245a of the purge gas supply system.

The remnant reactive gas or reaction byproducts are supplied from the processing space 201 into the exhaust buffer chamber 209, flow through the second exhaust pipe 222 of the second gas exhaust system, and are exhausted. Specifically, the valve of the second gas exhaust system is put into an open state, and a pressure of the processing space 201 is controlled by the APC 223 to be a predetermined pressure. Also, all the valves of the exhaust systems other than the valve of the second gas exhaust system are in a closed state.

As the exhaust buffer chamber 209 is heated to the temperature that is higher than the self-decomposition temperature of the source gas, e.g. the temperature that a reactant gas can react with a source gas, most of the excess reactant gas may react with the film containing source materials deposited on the wall of the exhaust buffer chamber 209, thus, silicon nitride (SiN) film having a dense structure may be formed. The film having a dense structure may be hard to come off the wall because film stress is approximately uniform. Therefore, the film which came off is less likely to flow backward in the processing space 201. On the other hand, the excess gas in the buffer chamber 209 is exhausted through second exhaust pipe 222. As the temperature of the inside of the second exhaust pipe 222, unlike the buffer chamber 209, is controlled to the temperature that the gas cannot deposit on it, the gases can be exhausted without depositing on the inner wall of second exhaust pipe 222.

In addition, pressure of the buffer chamber 209 may become higher than pressure of the second exhaust pipe 222 around the exhaust hole 221 for communicating between the buffer chamber 209 and the second exhaust pipe 222, because the temperature of the buffer chamber 209 is higher than that of the second exhaust pipe 222. Therefore, gas flows from the buffer chamber 209 to second exhaust pipe 222 may be formed, and exhaust efficiency becomes higher. By increasing the exhaust efficiency, it is restrained that excess gas flows backward in the processing space 201.

After a predetermined time has elapsed since the supply of the reactive gas started, the valve 244d is closed off, and the supply of the reactive gas is stopped. A supply time of the reactive gas and the carrier gas is in the range of, for example, 2 seconds to 20 seconds.

(Second Shower Head Exhaust Process S210)

After the supply of the reactive gas is stopped, a second shower head exhaust process S210 is performed to remove the reactive gas or reaction byproducts remaining in the shower head 230. Sine the second shower head exhaust process S210 may be performed in the same manner as the previously described first shower head exhaust process S204, descriptions thereof are omitted here.

(Second Processing Space Exhaust Process S212)

After the purge of the shower head 230 ends, a second processing space exhaust process S212 is performed to remove the reactive gas or reaction byproducts remaining in the processing space 201. Since the second processing space exhaust process S212 may be performed in the same manner as the previously described first processing space exhaust process S206, descriptions thereof are omitted here.

(Determining Process S214)

The above-described first process gas supply process S202, first shower head exhaust process S204, first processing space exhaust process S206, second process gas supply process S208, second shower head exhaust process S210, and second processing space exhaust process S212 are included in one cycle. The controller 260 determines whether the cycle has been performed a predetermined number of times (n cycles) (S214). When the cycle has been performed the predetermined number of times, a silicon nitride (SiN) film is formed on the wafer 200 to a predetermined film thickness.

(Processed Wafer Number Determining Process S106)

After the film forming process S104 including the above-described processes S202 to S214 is performed, as shown in FIG. 5, it is determined whether the number of wafers 200 processed during the film forming process S104 has reached a predetermined number (S106).

When the number of the wafers 200 processed in the film forming process S104 has not reached the predetermined number, the processed wafers 200 are withdrawn, and the substrate processing process enters a substrate loading/unloading process S108 to start processing the next wafer 200 which is on standby. Also, when the film forming process S104 has been performed on a predetermined number of wafers 200, the processed wafers 200 are withdrawn, and the substrate processing process enters a substrate unloading process S110 to enter into a state where the wafer 200 is absent in the process container 202.

(Substrate Loading/Unloading Process S108)

In the substrate loading/unloading process S108, by lowering the substrate support 212, the wafer 200 is supported on the lift pins 207 protruding from the surface of the substrate support 212. Thus, the wafer 200 is moved from the process position to the transfer position. Afterwards, the gate valve 205 is opened, and the wafer 200 is unloaded out of the process container 202 using a wafer carrier. In this case, the valve 245d is closed off, and the supply of the inert gas through the third gas supply system into the process container 202 is stopped.

While the wafer 200 is being moved from the process position to the transfer position during the substrate loading/unloading process S108, the valve of the second gas exhaust system is put into a closed state, and the control of a pressure due to the APC 223 is stopped. Meanwhile, by putting the valve of the first gas exhaust system into an open state and exhausting the atmosphere of the transfer space 203 using the TMP and the DP, the process container 202 is maintained in a high vacuum (ultrahigh vacuum) state (e.g., a pressure of $10_{-5}$ Pa or less), and a difference in pressure between the process container 202 and the carry chamber similarly maintained in a high vacuum (ultrahigh vacuum) state (e.g., a pressure of $10^{-6}$ Pa or less) is reduced. In this state, the gate valve 205 is opened, and the wafer 200 is unloaded from the process container 202 into the carry chamber.

Afterwards, in the substrate loading/unloading process S108, the next new wafer 200 which is on standby is loaded into the process container 202 in the same order as in the above-described substrate loading/placing process S102. The wafer 200 is elevated to the process position in the processing space 201 and also, the inside of the processing space 201 is set to a predetermined process temperature and a predetermined process pressure to enter into a state where the next film forming process S104 may start. Also, the film forming process S104 and the processed wafer number determining process S106 are performed on the new wafer 200 in the processing space 201.

(Substrate Unloading Process S110)

In the substrate unloading process S110, the wafer 200 which has been processed in the same order as in the above-described substrate loading/unloading process S108 is withdrawn from the process container 202 and loaded into the carry chamber. However, unlike in the substrate loading/unloading process S108, in the substrate unloading process S110, the loading of the next new wafer 200 which is on standby into the process container 202 is not performed, and the wafer 200 is absent in the process container 202.

When the substrate unloading process S110 ends, the substrate processing process enters a cleaning process.

(4) Cleaning Process

Next, a process of cleaning the inside of the process container 202 of the substrate processing apparatus 100 as one process of the method of manufacturing the semiconductor device will be described with reference to FIG. 4.

(Cleaning Process S112)

In the substrate processing apparatus 100, the film forming process S104 is performed on a predetermined number of wafers 200 each time the substrate unloading process 5110 ends, and thereafter a cleaning process S112 is performed each time the substrate processing process is put into a state where the wafer 200 is absent in the process container 202.

In this cleaning process, the valve 249d is opened under the state where the wafer 200 is absent in the process container 202, then a cleaning gas is supplied into the buffer space 232, processing space 201 or exhaust buffer chamber. The supplied cleaning gas removes deposits (reaction byproducts, etc.) adhered to the wall defining the buffer space 232, the walls defining the processing space 201 or the inner wall of the exhaust buffer chamber 209. Then, the cleaning gas is exhausted via the second exhaust pipe 222.

In this embodiment, a film having a dense structure is deposited on the inner wall of the exhaust buffer chamber 209. Therefore, though the cleaning gas may pass through the exhaust buffer chamber 209, the inner wall of the exhaust buffer chamber 209 may not be etched excessively by the cleaning gas.

In addition, the adhered materials adhered to the walls defining the processing space 201 are less liable to be delaminated than adhered materials adhered to the inner wall of the exhaust buffer chamber 209. The adhered materials adhered to the inner wall of the exhaust buffer chamber 209 are unstable in terms of a film thickness or film density because the adhered materials are adhered under different temperature and pressure conditions from film forming conditions. However, the adhered materials adhered to the walls defining the processing space 201 are stable in terms of a film thickness or film density because the adhered materials are adhered under the same temperature and pressure conditions as the film forming conditions.

Therefore, when supplying a cleaning gas having high activated energy so as to etch the adhered materials adhered to the walls defining the processing space 201, there is a possibility that the inner wall of the exhaust buffer chamber 209 is etched excessively. However, since the cleaning gas supplied into the exhaust buffer chamber 209 through the buffer space 232 and the processing space 201, has been etching some surfaces or walls of the process container 202, gas guide 235, dispersion plate 234, substrate support 212 etc., the activated energy of the cleaning gas is steadily decreased on the way of such gas travel. Therefore, the inner wall of the exhaust buffer chamber 209 is less likely to be etched excessively by the cleaning gas.

<Exemplary Embodiments Of The Present Disclosure>

Exemplary embodiments of the present disclosure will be supplementarily described below.

[Supplementary Note 1]

According to one aspect of the present disclosure, there is provided a substrate processing apparatus including:

a processing space configured to process a substrate placed on a substrate receiving surface on a substrate support;

a gas supply system configured to supply gases into the processing space through a side facing the substrate receiving surface;

an exhaust buffer chamber including a communication hole communicating with the processing space at least at a side portion of the processing space and a gas flow blocking wall extending in a blocking direction of the gases flowing through the communication hole; and a first heater configured to heat the exhaust buffer chamber.

In other words, the gas supplying system is configured to supply gases into the processing space from the opposite side of the substrate receiving surface.

[Supplementary Note 2]

The substrate processing apparatus according to Supplementary note 1, wherein the exhaust buffer chamber further includes a gas exhaust system configured to exhaust the gases from the exhaust buffer chamber.

[Supplementary Note 3]

The substrate processing apparatus according to any of the preceding Supplementary notes, wherein the exhaust buffer chamber includes a space having one sidewall serving as the gas flow blocking wall, the communication hole is disposed in another sidewall disposed opposite to the one sidewall of the space of the exhaust buffer chamber, and the space of the exhaust buffer chamber extends to surround an outer circumference of the side portion of the processing space.

[Supplementary Note 4]

The substrate processing apparatus according to any of the preceding Supplementary notes, wherein the first heater is disposed along circumference of the exhaust buffer chamber.

[Supplementary Note 5]

The substrate processing apparatus according to any of the preceding Supplementary notes, wherein the substrate support includes a second heater, further including a controller configured to control the first and second heaters so as to heat the first and second heaters while supplying a gas into the processing space.

[Supplementary Note 6]

The substrate processing apparatus according to Supplementary note 5, wherein the controller configured to set the temperature of the first heater to become higher than the temperature of the second heater.

[Supplementary Note 7]

The substrate processing apparatus according to Supplementary note 6, wherein the controller configured to set the temperature of the second heater to become the temperature so as not to decompose a gas.

[Supplementary Note 8]

The substrate processing apparatus of any one of Supplementary notes 2 through 7, wherein the gas exhaust system includes an exhaust pipe having a third heater, the controller configured to set the temperature of the first heater to become higher than the temperature of the third heater while supplying a gas into the processing space.

[Supplementary Note 9]

According to still another aspect of the present disclosure, there is provided a method of manufacturing a semiconductor device, including:

(a) placing a substrate on a substrate receiving surface of substrate support assembly in a processing space; and (b) supplying a gas into the processing space through a side facing the substrate receiving surface, simultaneously heating an exhaust buffer chamber including a communication hole communicating with the processing space at least at a side portion of the processing space and a gas flow blocking wall extending in a blocking direction of the gases flowing through the communication hole.

[Supplementary Note 10]

According to another aspect of the present disclosure, there is provided a program that causes a computer to perform sequences of:

(a) placing a substrate on a substrate receiving surface of substrate support assembly in a processing space; and (b) supplying a gas into the processing space through a side facing the substrate receiving surface, simultaneously heating an exhaust buffer chamber including a communication hole communicating with the processing space at least at a side portion of the processing space and a gas flow blocking wall extending in a blocking direction of the gases flowing through the communication hole.

[Supplementary Note 11]

According to still another aspect of the present disclosure, there is provided a non-transitory computer-readable recording medium storing a program for manufacturing a semiconductor devise, the program causes a computer to perform sequences of:

(a) placing a substrate on a substrate receiving surface of substrate support assembly in a processing space; and (b) supplying a gas into the processing space through a side facing the substrate receiving surface, simultaneously heating an exhaust buffer chamber including a communication hole communicating with the processing space at least at a side portion of the processing space and a gas flow blocking wall extending in a blocking direction of the gases flowing through the communication hole.

What is claimed is:

1. A substrate processing apparatus comprising:
    a processing space configured to process a substrate placed on a substrate receiving surface on a substrate support;
    a gas supply system configured to supply gases into the processing space from an opposite side of the substrate receiving surface;
    an exhaust buffer chamber disposed at a side portion of the processing space, the exhaust buffer chamber being formed by at least an upper wall as a ceiling, a partition plate as a bottom wall, an inner circumferential side wall having a communication slit for exhausting gases from the processing space;
    a gas flow blocking wall, at least partially defining the exhaust buffer chamber, the gas flow blocking wall extending in a blocking direction to block the principal flow of the exhausting gases, the gas flow blocking wall having an exhaust hole for exhausting gases in the exhaust buffer chamber;
    a principal flow path of the exhausting gases is arranged in a horizontal direction along the partition plate, wherein the processing space, the communication slit, and the exhaust hole are aligned in a straight line in the horizontal direction on the principal flow path;
    a first heating element embedded in the gas flow blocking wall, the first heating element being configured to heat at least an inner circumferential surface of the gas flow blocking wall;
    a second heating element embedded in the upper wall or the bottom wall of the exhaust buffer chamber; and a controller configured to control the gas supply system, the first heating element and the second heating element, so that a temperature of the inner circumferential surface of the gas flow blocking wall is higher than a temperature of an inner circumferential surface of the upper wall or the bottom wall of the exhaust buffer chamber.

2. The substrate processing apparatus according to claim 1, further comprising:
   a substrate support heating element embedded in the substrate support; and
   wherein the controller is configured to control the gas supply system, the first heating element and the substrate support heating element, so that the gas flow blocking wall and the substrate support are heated, while delivering a process gas to the processing space.

3. The substrate processing apparatus according to claim 2, wherein the controller is configured to further control the first heating element and the substrate support heating element so that the temperature of the blocking wall becomes higher than the temperature of the substrate support.

4. The substrate processing apparatus according to claim 2, wherein the controller is configured to further control the substrate support heating element so that the temperature of the substrate placed on the substrate receiving surface of the substrate support becomes lower than a temperature causing the process gas to decompose, the temperature causing the process gas to decompose is identified according to a recipe installed in the substrate processing apparatus.

5. The substrate processing apparatus according to claim 2, wherein the controller is configured to further control the first heating element so that the temperature of the gas flow blocking wall becomes higher than a temperature causing the process gas to decompose, the temperature causing the process gas to decompose is identified according to a recipe installed in the substrate processing apparatus.

6. The substrate processing apparatus according to claim 4, wherein the controller is configured to further control the first heating element so that the temperature of the gas flow blocking wall becomes higher than the temperature causing the process gas to decompose, the temperature causing the process gas to decompose is identified according to a recipe installed in the substrate processing apparatus.

7. The substrate processing apparatus according to claim 2, further comprising:
   a gas exhaust system, connected to the exhaust buffer chamber, at least including an exhaust pipe having a third heating element;
   wherein the controller is configured to further control the first heating element and the third heating element so that the temperature of the gas flow blocking wall becomes higher than the temperature of an inside wall of the exhaust pipe.

8. The substrate processing apparatus according to claim 2, further comprising:
   a gas exhaust system, connected to the exhaust buffer chamber, at least including an exhaust pipe having a third heating element;
   wherein the controller is configured to further control the third heating element so that the temperature of an inside wall of the exhaust pipe becomes higher than the temperature at which the gas deposits on the inside wall of the exhaust pipe, while delivering the process gas to the processing space.

9. The substrate processing apparatus according to claim 2, wherein the controller is configured to further control the first heating element and the substrate support heating element so that the temperature of the blocking wall becomes higher than the temperature of the substrate support.

* * * * *